(12) United States Patent
Jensen

(10) Patent No.: US 6,466,630 B1
(45) Date of Patent: Oct. 15, 2002

(54) SYMBOL SYNCHRONIZATION IN A CONTINUOUS PHASE MODULATION COMMUNICATIONS RECEIVER

(75) Inventor: James Robert Jensen, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/246,214

(22) Filed: Jan. 27, 1999

(51) Int. Cl.[7] .............................. H03D 3/18; H03D 3/24
(52) U.S. Cl. ........................ 375/327; 375/376
(58) Field of Search ................. 375/327, 376, 375/373, 375, 294, 316, 354, 370; 327/147, 156, 141

(56) References Cited

U.S. PATENT DOCUMENTS 5,461,646 A * 10/1995 Anvari ....................... 375/347
5,574,751 A * 11/1996 Trelewicz .................... 375/265
6,304,620 B1 * 10/2001 Rouphael .................... 375/344

* cited by examiner

*Primary Examiner*—Chi Pham
*Assistant Examiner*—Khai Tran
(74) *Attorney, Agent, or Firm*—Francis A. Cooch

(57) ABSTRACT

Symbol synchronization in a continuous phase modulation receiver is achieved by calculating an arctangent function of a digital sample of the output of a quadrature demodulator. This signal is sampled by integration techniques or filtered to produce signals that represent a complex value whose phase changes at a rate which is half of the symbol rate. The complex value may be squared and rotated by an angle which is related to the symbol phase. The integrated sample or an arctangent function of the filtered sample is used as a controlling input for a numerically controlled oscillator which regulates the digital sampling.

19 Claims, 9 Drawing Sheets

SHORT LOOP RECEIVER

LONG LOOP RECEIVER

SYMBOL SYNCHRONIZATION IN A CONTINUOUS PHASE MODULATION COMMUNICATIONS RECEIVER

STATEMENT OF GOVERNMENTAL INTEREST

The Government has rights in this invention pursuant to Contract No. DAAB07-96-A257 awarded by the Department of the Army.

BACKGROUND OF THE INVENTION

1. Field of the Invention

This invention relates to a timing recovery method and apparatus for symbol synchronization that overcomes timing problems encountered in general continuous phase modulation schemes.

2. Discussion of the Related Art

In March of 1981, T. Aulin, N. Rydbeck and C. Sundberg described a constant envelope modulation scheme as a method of continuous phase modulation at pages 196 through 225 of Vol. 29 of the IEEE Transactions on Communications. The method is plagued by synchronization problems created by the inexact timing recovery methods available in tha analog realm used. The problems were partially rectified by the work of B. Lankl and K. Friederichs which provided a digital phase detector that was independant of the carrier phase. Their efforts were presented on Nov. 15, 1995 and published in Vol. 2 of the IEEE Global Telecommunications Conference of that date.

The Lankl and Friederichs method for symbol synchronization is illustrated in FIG. 1. The modulation phase is detected by converting the sampled output of a quadrature receiver to a phase angle. The phase is delayed by the time between symbol starts and then subtracted from the current phase. This differencing removes the effects of residual carrier in the sampled values.

A nonlinear operation is performed on the differenced phase by computing the cosine of the scaled difference. The value of the scaling factor depends on the specific modulation being employed. The output of this nonlinear operation is multiplied by the value of a cosine function with a period equal to the symbol rate. The output of the mixing is an error signal that controls the phase locked loop by adjusting the oscillator that determines the sampling times in the quadrature receiver.

In Lankl and Friederichs, for modulations in which the phase is piecewise linear, the interpolation filter allows for digitization at a rate that is twice the rate at which new symbols are added to the data stream.

A. D'Andrea, U. Merigali, and M. Morelli developed a method for recovery of symbol timing which was published at pages 1362 through 1372 of Vol. 10 of the IEEE Transactions on Communications, October 1996. The method considers an optional statistical estimator and makes a series of approximations thereto to obtain an easily implemented approach. Because of the series of approximations, the final method is not optimal.

SUMMARY OF THE INVENTION

The primary objective of the invention is to provide a new method for timing recovery and symbol synchronization in a continuous phase demodulator that overcomes the problems of symbol synchronization for a general continuous phase modulation system.

The method is linear in the phase up to an inverse tangent function error detector. This linearity makes possible the application of the method of the invention in cases where the modulation is not binary.

In the method, the symbol phase error is determined by the output of a complex filter which must have an output magnitude that is nonzero if the phase is to be determined. The magnitude depends on the amount of overlap of the Fourier transform of a phase modulation function with a replica of the transform shifted by $2\pi/T$ where T is the time interval between symbol starts. Thus some of the energy in the phase modulation function must lay at frequencies that are more than half of the symbol rate or no overlap will exist.

In an example presented here, the error filter has been designed for a modulation function which is nonzero over an interval that is 16 times the time between successive symbol starts. It is assumed that 4 samples are collected during the time between each symbol start so that the length of the modulation is 64 samples.

The imaginary part of the filter output is zero at every offset that corresponds to an integral number of symbol start intervals. This is the basis for the symbol phase error.

The symbol synchronization procedure is independent of the modulation index and the size of the symbol set. There is no constraint on the modulation index to be a rational value.

In addition to tracking, acquisition of the symbol phase and frequency are also achieved by the methods of the invention.

The symbol phase synchronization procedure described hereby is tolerant to the presence of unremoved carrier phase. Such a phase will be present if the LO signal does not exactly match the carrier frequency in the I.F. channel input. The carrier phase tolerance comes about because the error detection filter produces a zero response for a DC input.

DESCRIPTION OF THE PREFERRED EMBODIMENTS

Figure 1:
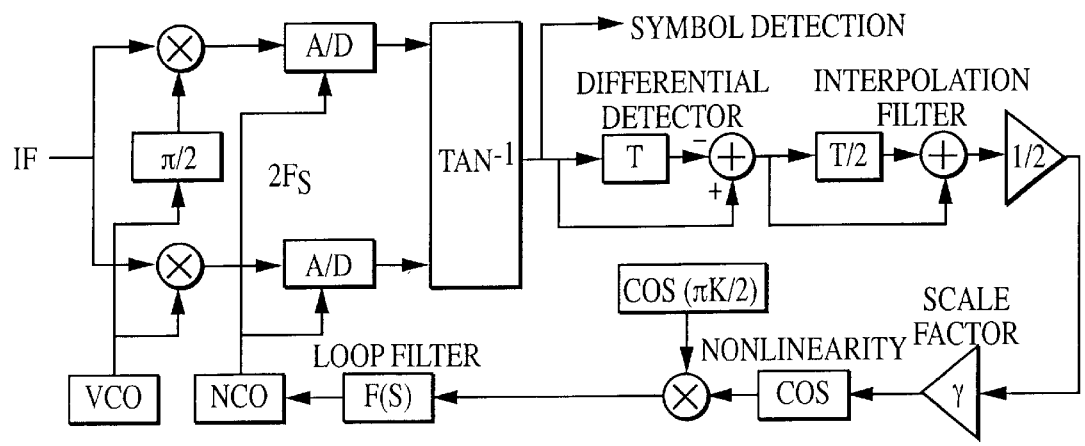
FIG. 1 is a block diagram of the prior art symbol phase synchronization method of Lankl and Friederichs.

Continuous phase modulation of a transmitted signal produces a strong spectral line positioned at the clock frequency in a cosine function of the received signal. Thus a demodulator such as illustrated by FIG. 1 may be used to achieve symbol synchronization in special cases. Such demodulator systems incorporate a quadrature demodulator which provides inputs to analog-to-digital converters. The sampled and quantized outputs of the A/D converters are combined to produce an arctangent function using a lookup table or equivalent calculations. This signal may be processed to provide phase and frequency data using a phase locked loop.

In order to set up a phase locked loop for timing recovery, the phase information of the spectral line at the transmitter clock frequency is needed. Phase information may be extracted by converting the clock spectral line frequency to zero. The timing phase may then be equated to the mean output voltage of a detector. This may be performed digitally such as in the prior art Lanki and Friederichs system, illustrated by FIG. 1, wherein a digital realization is proposed with N=4 samples per symbol duration T. In this system frequency conversion is effected by a multiplication using $\sin(\pi k/2)$. At sampling instants of k=0+lN and k=2+lN, the sine signal is zero. Therefore it is necessary to use only 2 samples per duration T. Signal estimation requires those samples exactly at k=0+lN and k=2+lN. Problems created by more samples per symbol are avoided by using interpolation filtering in the timing phase detector signal path which determines the desired samples at k=1+lN and k=3+lN. This allows operation at twice the symbol rate. The block diagram presented by FIG. 1 uses the simplest possible interpolation filter. It consists of one adder and a multiplication by a factor of ½, providing linear interpolation between two subsequent samples. In the prior art presented by FIG. 1, this occurs in the phase locked loop as the input to the cosine nonlinearity step. Using this prior art technique, correct phase timing is obtained by forcing the imaginary part of the expected value of the clock spectral line to zero by using 4 samples per symbol duration and introducing an interpolation filter to provide the required 2 samples per symbol duration.

The present invention improves on the above described prior art systems by providing methods for general continuous phase modulation (CPM) symbol synchronization to support newly proposed modulation types as an alternative to systems which are useful only in special cases. Its development is based on a method proposed by Lankl and Friederichs and previously discussed herein. That method was found lacking in that it is feasible only for special cases concerning binary symbols.

This invention describes new methods for symbol synchronization not limited to special cases. Their applications are presented as simulations to illustrate their potential performance and provide proof-of-principle demonstrations of the methods.

The methods presented by the present invention may best be understood by first considering the prior art method proposed by Lankl and Friederichs.

In the Lankl and Friederichs method for symbol synchronization illustrated in FIG. 1, the modulation phase is detected by converting the sampled output of a quadrature demodulator to a phase angle. The phase is delayed by the time between symbol starts and then subtracted from the current phase. This differencing removes the effects of residual carrier in the sampled values.

A nonlinear operation is performed on the differenced phase by computing the cosine of the scaled difference. The value of the scaling factor depends on the specific modulation being employed. The output of this nonlinear operation is multiplied by the value of a cosine function with a period equal to the symbol rate. The output of this mixing is the error signal that controls the phase locked loop by adjusting the oscillator that determines the sampling times in the quadrature receiver.

An interpolation filter allows for digitization at a rate that is twice the rate at which new symbols are added to the data stream. This was proposed by Lanki and Friederichs in the context of modulations in which the phase is piecewise linear.

Figure 2:
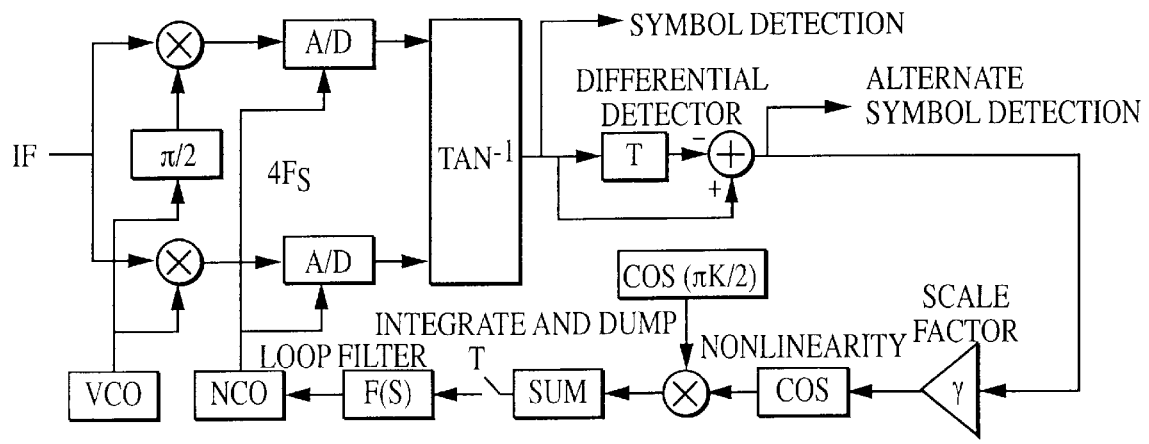
FIG. 2 is a block diagram of the steps comprising the first embodiment of the invention which improves over the prior art by doubling the sampling rate, eliminating the interpolation filter, and adding an integration-dump step.

The method of Lankl and Friederichs is improved by the present invention which increases the sample rate to four times the rate at which symbols start and removes the interpolation filter, as shown in FIG. 2. This provides a method usable with phase modulations when the phase is not piecewise linear.

In FIG. 2 the output of a quadrature demodulator is sampled and quantized by a pair of analog-to-digital, A/D, converters which apply their outputs to a means to produce an arctangent function. A phase locked loop includes an optional differential detector for eliminating carrier influences when it is beneficial within the modulation system being practiced, otherwise, this step is eliminated, and a scaling means which applies a scaled function of the feedback signal to a means for adjusting nonlinearity via a cosine function. The feedback signal is then integrated and periodically dumped to insure that the input to the feedback loop filter is zero when the loop is in synchronization. The output of the feedback loop filter is applied to a numerically controlled oscillator, NCO, which regulates the A/D converters.

The improvement of adding an integrate-and-dump step to sample the output of the mixer following the nonlinear operation ensures that the input to the loop filter is zero when the loop is in proper synchronization. The loop filter is then updated at the symbol rate. This improvement eliminates jitter that would otherwise be present in the sample timing even when the loop is synchronized.

The steps of the first embodiment of the inventive method are illustrated by the block diagram of FIG. 2. The principle steps are: 1) digitaizing the output of a quadrature demodulator as a function of a numerically controlled oscillator; 2) calculating an arctangent function from the digital data; 3) for the modulation systems which benefit by this step, eliminate carrier influences from the arctangent function by way of a differential detector; 4) sample the arctangent function with an integrate and dump sequence; 5) filter the sample with a loop filter of the type normally used in the industry, for example, a filter which exhibits the properties expressed by equation 16; and 6) control the numerically controlled oscillator with an output function of the integrated and dumped arctangent signal.

The first embodiment achieves synchronization for all modulation types listed in Table 1 when the modulation is binary. The modulation types and the appropriate values of the scale factor are presented in Table 1.

For the first three modulations listed in Table 1, the phase is linear within an interval of length T between the start of successive symbols. The scale factor is chosen such that the scaled phase changes by a multiple of $2\pi$ between symbol start times for any set of input symbols. When the loop is synchronized, the output of the integrate-and-dump step is zero and the loop filter output remains unchanged. When the sample frequency is correct, the output of the integrate-and-dump is zero even when the sample phase is incorrect if the scaled phase remains constant or changes by more than $2\pi$ over an interval T. The error that is the source of synchronization results from the symbol sequences that result in a change of exactly $2\pi$. This is true only for the piecewise linear modulations.

The phase is not piecewise linear for the last three modulations shown in Table 1 but they are close enough to being piecewise linear to result in successful synchronization using the steps shown in FIG. 2. Each of these latter modulations is similar to one of the piecewise linear modulations and the scale factor is chosen on the basis of this similarity. In order to best exploit this similarity, the modulation index is taken in each case so that the integrated phase due to each symbol matches the continuous phase modulation (CPM) value of $\pi/2$.

| MODULATION | BINARY | 4-ary | 8-ary |
| --- | --- | --- | --- |
| MSK | 2 | 6 | 14 |
| 2-REC | 4 | 12 | 28 |
| TFM | 8 | 24 | 56 |
| biorthogonal | 8 | 24 | 56 |
| self-orthogonal | 2 | 6 | 14 |
| GMSK | 8 | 24 | 56 |

Table 1. Modulations and scale factors used in simulations of symbol synchronization with the method of the first embodiment.

When the symbol set is increased from the binary case to the more general M-ary case, the method of the first embodiment continues to work for the modulations that are piecewise linear. In all cases, the symbol values are evenly spaced with extreme values of ±1. The scale factor is increased as the number of possible symbols increases, as shown in Table 1. Successful tracking occurs for the piecewise linear modulations since the scaled phase still changes by a multiple of $2\pi$ over the interval between symbol starts.

Symbol synchronization fails, however, for the nonlinear modulations when 4-ary and 8-ary modulations are encountered. The phase change is not piecewise linear enough to result in a small error signal when the loop is synchronized and the loop does not hold lock even when initialized with the proper frequency and phase. Attempts to improve performance through variations in the scale factor and the loop filter parameters do not result in successful tracking.

Figure 3:
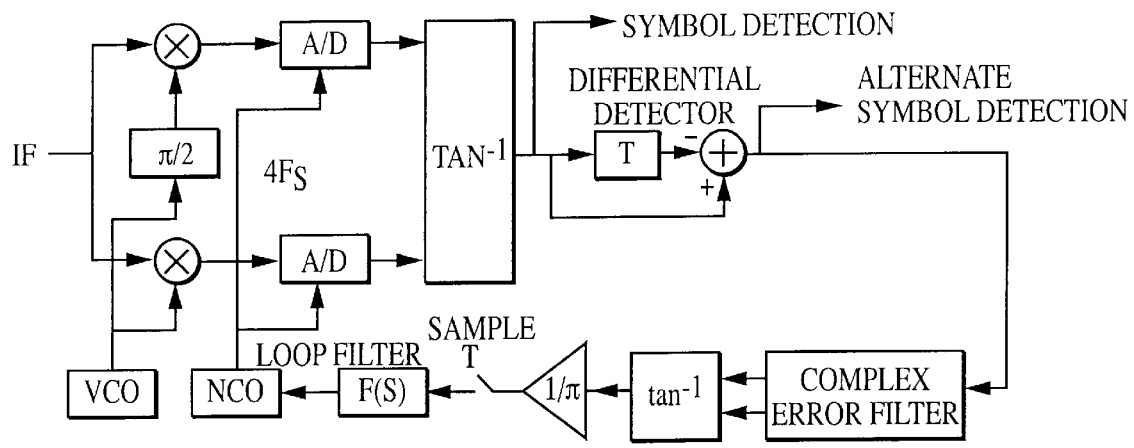
FIG. 3 is a block diagram of the steps comprising the second embodiment of the inventive method for continuous phase modulation symbol phase tracking.

The second embodiment of the inventive method for symbol synchronization overcomes the problems of symbol synchronization for a general continuous phase modulation. A block diagram of the steps of the method is shown in FIG. 3. The principle steps are: 1) generate a digital sample of the output of a quadrature demodulator as a function of a numerically controlled oscillator; 2) calculate an arctangent function of the digital sample; 3) for modulation systems which benefit by this step, eliminate carrier influences from the arctangent function with of a differential detector; 4) produce a pair of signals from the arctangent function with a complex error filter such as defined by the impulse response $[q(t)-q(t-T)]\exp\{i\pi t/T\}$ where q(t) is the continuous phase modulation function and T is the interval between the start of successive symbols; 5) calculate a secondary arctangent function from the pair of signals; 6) sample the secondary arctangent function to produce a phase related signal; 7) filter the phase related signal with a loop filter of the type normally used in the industry, for example, a filter which exhibits the properties expressed by equation 16; and 8) control the numerically controlled oscillator with the phase related signal.

The system of the second embodiment is linear in the phase up to the error detector, which is an inverse tangent function. This linearity makes possible the application of the system in cases where the modulation is not binary.

Using standard CPM notation, the modulation phase is $$\varphi(t) = 2\pi h \sum_n a_n q(t - nT) \qquad (1)$$

where h is the modulation index, $\{a_n\}$ is the set of transmitted symbol values, q(t) is the phase modulation function, and T is the time between the transmission of successive symbols.

The modulation phase can be differenced over an interval of length T to produce a phase $$\phi(t) = \varphi(t) - \varphi(t - T) = \sum_n a_n s(t - nT) \qquad (2)$$

where $$s(t) = 2\pi h[q(t) - q(t-T)] \qquad (3)$$

The phase function $\phi(t)$ may experience "wrap around" if the modulation index is large. In some cases it may be necessary to unwrap the phase after detection so that it is a continuous function of time.

Given the time series $\phi(t)$ or $\phi(t)$, the problem at hand is to determine the symbol phase so that the symbols can be properly recovered. Symbol phase recovery will be performed under two restrictions:

The symbol phase is not synchronous with the carrier phase. In some systems, a synchronous relationship exists between the symbols and the carrier and this relationship can be used in establishing the symbol frequency. In other situations, such as time division multiplexing, such a relationship will not exist because of the independence of the symbol clock and the carrier time base.

No use will be made of specific data patterns placed in the channel for the purpose of aiding symbol synchronization. This will allow for synchronization to be performed at an arbitrary point in a transmission.

Figure 8:
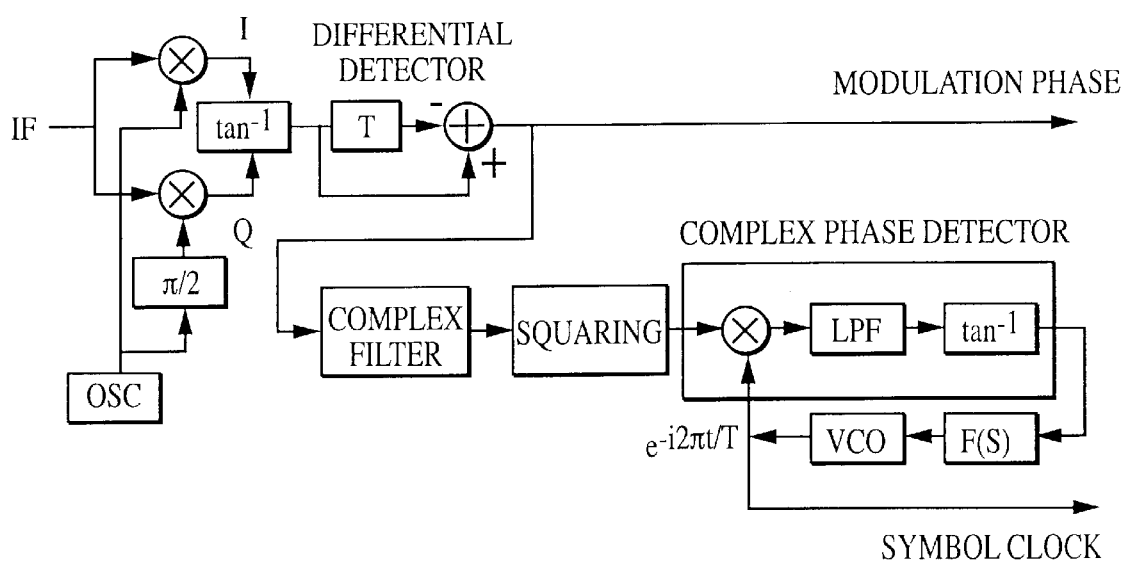
FIG. 8 is a block diagram of the receiver for the extraction of the symbol phase from the modulation phase. The complex filter is matched to the form of the modulation function used by the transmitter. The VCO phase follows the symbols phase when the loop is phase locked.

A receiver that will determine the symbol phase subject to these restrictions is shown in FIG. 8. The receiver consists of a quadrature mixer to extract the differenced modulation phase $\phi(t)$. The remainder of the receiver includes a VCO that will be locked to the symbol phase.

The differenced phase function s(t) is assumed to be nonzero only for t>0. That is, $$s(t)=0 \text{ if } t<0 \qquad (4)$$

We define a new, complex function f(t) as $$f(t)=s(t)\times e^{i\pi t/T} \qquad (5)$$

This is the impulse response of the complex filter shown in FIG. 8. In general, this impulse response will have compact support due to the nature of q(t).

In FIG. 8, the receiver for the extraction of the symbol phase from the modulation phase, the complex filter is matched to the form of the modulation function used by the transmitter. The VCO phase follows the symbols phase when the loop is phase locked.

The output of the complex filter will be denoted c(t) and can be written as $$c(t) = \int_0^\infty dt' \phi(t-t')f(t') = \qquad (6)$$

$$\sum_n a_n \int_{-\infty}^\infty dt' s(t-t'-nT)s(t')e^{2\pi i t/T} = e^{i\pi t/T}\sum_n a_n(-1)^n A(t-nT)$$

where $$A(t) = \int_{-\infty}^\infty dt' s\left(\frac{t}{2}-t'\right)s\left(\frac{t}{2}+t'\right)e^{i2\pi t'/T} = \qquad (7)$$

$$\int_{-\infty}^\infty dt' s\left(\frac{t}{2}-t'\right)s\left(\frac{t}{2}+t'\right)\cos\left(\frac{2\pi t'}{T}\right)$$

The essential feature of A(t) is that it is real for all values of t and for all real functions s(t). The function A(t) therefore does not contribute to the phase of the filter output, c(t), beyond a possible change in sign.

Equation (6) is the key to the CPM symbol synchronization. The phase of the complex filter output changes over time with at a rate that is half of the symbol rate. The phase of the filter output is therefore an indicator of the symbol phase and can form the basis of a tracking loop or a symbol phase estimator.

The magnitude of the filter output must be nonzero if the phase is to be determined. The magnitude will depend on the amount of overlap of the Fourier transform of s(t) with a replica of the transform shifted by $2\pi/T$. If all of the energy in s(t) lies at frequencies that are less than half of the symbol rate, then no overlap will exist and the filter described by Equation (6) will be useless. For many modulations, energy exists beyond this point and can be used for synchronization.

Figure 4:
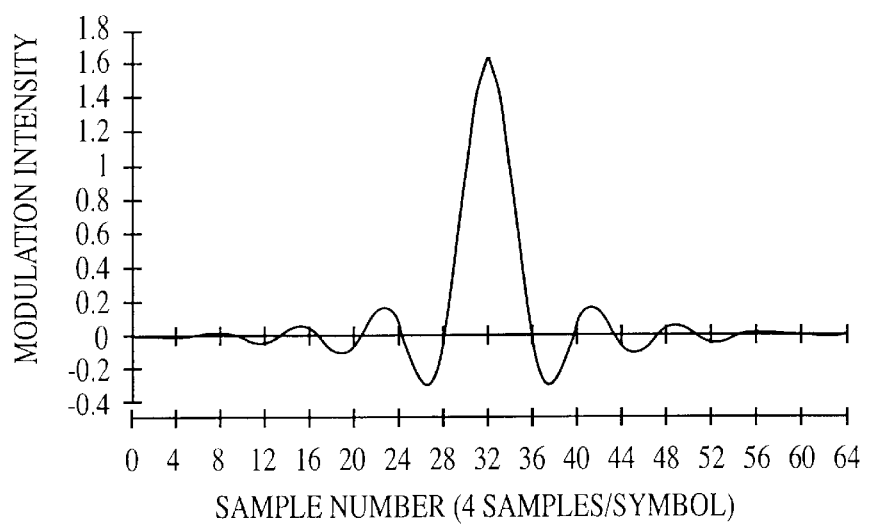
FIG. 4 is a graph of an example modulation function after differencing with 4 samples being taken per symbol start.

The error filter has been computed for the differenced modulation function s(t) shown in FIG. 4. This modulation has length of 16 T. It is assumed that 4 samples are collected during the time between each symbol start so that the length of the modulation is 64 samples.

Figure 5:
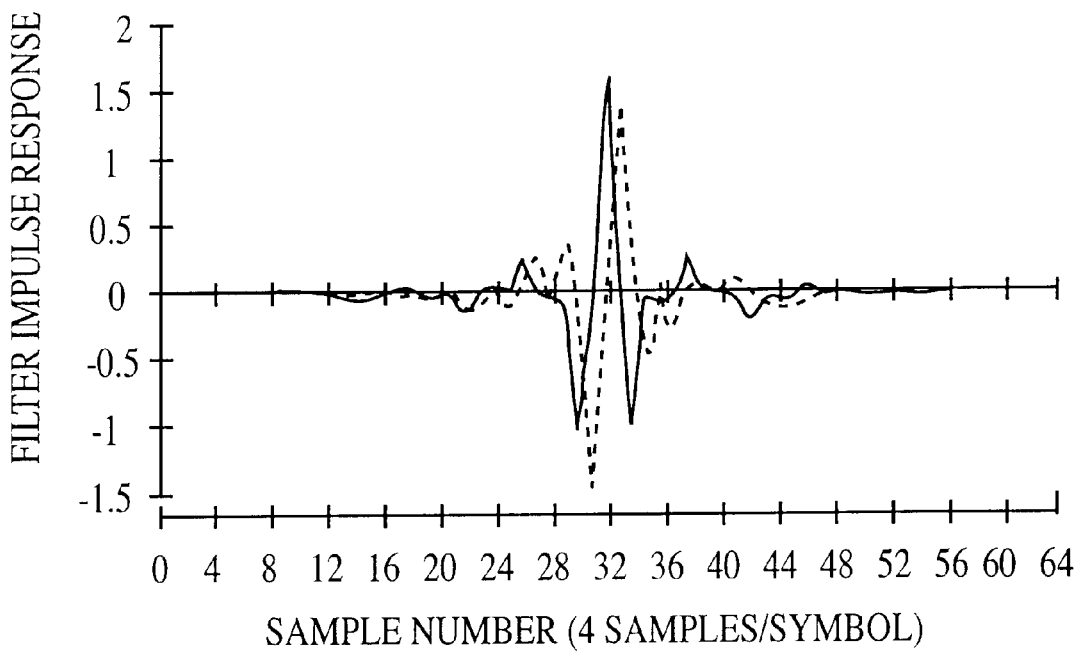
FIG. 5 is a graph of the real and imaginary parts of the filter impulse response for the modulation shown in FIG. 3 wherein the solid curve is real and the dashed curve is the imaginary part of the response.
Figure 6:
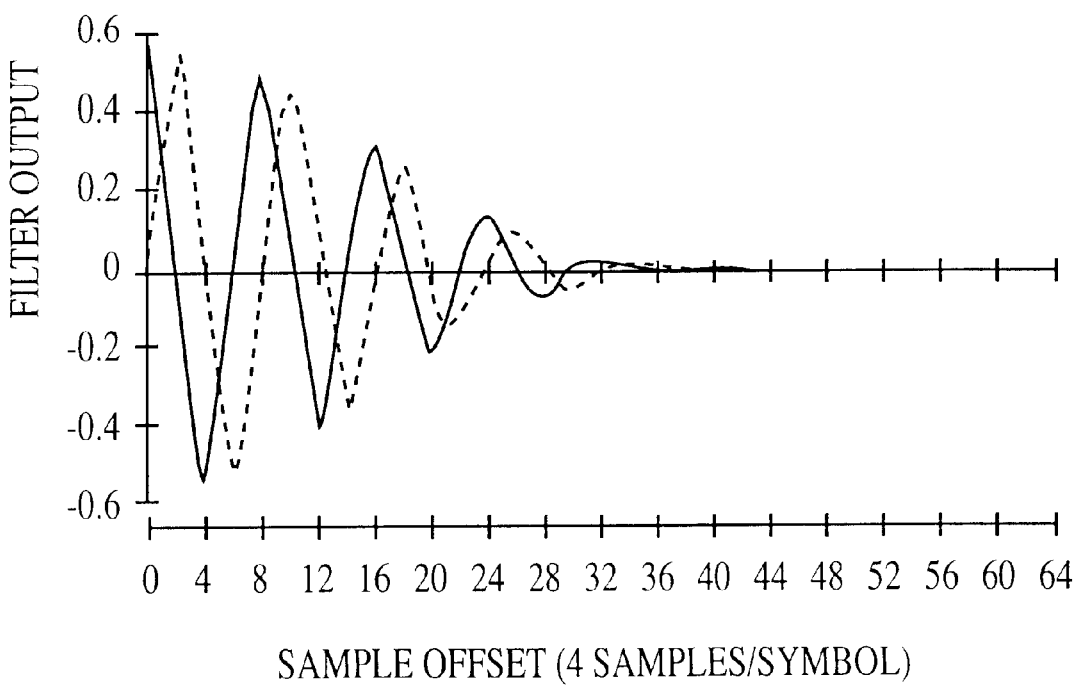
FIG. 6 is a graph of the real and imaginary parts of the filter output for the modulation shown in FIG. 3 and the filter response shown in FIG. 4. The solid curve is real and the dashed curve is the imaginary part of the filter output. Note that the imaginary part of the output is zero at all multiples of the symbol start interval.
Figure 7:
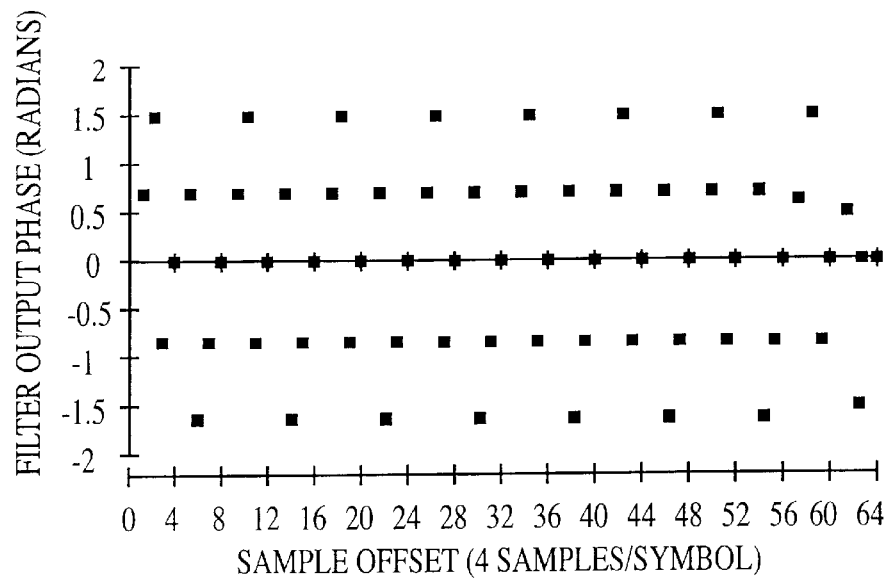
FIG. 7 is a plot of the phase of the filter output for the modulation shown in FIG. 5. The phase is zero at every symbol start interval; $\pm\pi/4$ for offsets of ¼ of a symbol start interval; and $\pm\pi/2$ for offsets of half of a symbol start interval.

The impulse response of the complex filter defined by Equation (6) is shown in FIG. 5. The output of the filter that results from passing the modulation through the filter is shown in FIG. 6. The imaginary part of the filter output is zero at every offset that corresponds to an integral number of symbol start intervals. This is the basis for the symbol phase error. The phase of the filter output is shown in FIG. 7. This phase is periodically zero.

The symbol synchronization procedure described by the diagramed steps of FIG. 3 is independent of the modulation index and the size of the symbol set. There is no constraint on the modulation index to be a rational value, as there is in some synchronization methods.

The method may be improved by the addition of filtering prior to the second arctangent. Two factors must be accounted for in tracking the symbol phase. One is that value in the sum in Equation (6) is a function of the particular symbol sequence. Its amplitude and sign will change with time. The phase of the filter output will therefore experience occasional phase jumps of $\pi$. Furthermore, phase noise will be present in general and will contribute to the filter output. When the symbol values are such that the signal amplitude is small, the phase of the filter output will be dominated by phase noise. It is desirable to perform some filtering to reduce the impact of this noise.

Three alternatives have been considered in the performance of this embodiment. All three are successful in acquiring and tracking the symbol phase.

In the first alternative, the symbol phase is determined by sampling the phase of c(t) once per symbol interval T, wrapping this phase into an interval $\pm\pi/2$, and filtering this phase error. This is the approach of FIG. 3. The problem with this approach is that the filtering follows the nonlinear step of phase measurement and large phase errors introduce jitter into the tracking loop. This problem is mitigated to some extent by thresholding the filter output and defining the symbol phase error to be zero unless the magnitude of c(t) exceeds the threshold.

In the second alternative, the filter function $f(t)$ is redefined so that the output is reduced in bandwidth, thus filtering out some of the thermal noise. This results in a performance improvement over the previous approach, although it increases the support of the filter impulse response and complicates the implementation. When the symbol sequence is such that the filter output experiences a phase change of $\pi$, this approach results in suppression of the signal, as well as suppression of the noise.

The third approach averages the complex filter output after accounting for the possibility of phase jumps. This is accomplished by first squaring the complex filter output to achieve a phase doubling and producing a phase that changes by $2\pi$ in the symbol interval T. This phase is extracted through the use of a phase locked loop as shown in FIG. 8. This is the approach that is presented in the following explanation.

If the VCO phase is $\omega t+\beta$ at time t, then the output of the mixer can be written as $$c^2(t)e^{-i(\beta+\alpha x)} = \left[\int_0^\infty dt' \phi(t-t')f(t')\right]^2 e^{-i(\alpha x+\beta)} \qquad (8)$$

$$= e^{i[(\frac{2\pi}{T}-\omega)t-\beta]}\left[\sum_n a_n(-1)^2 A(t-nT)\right]^2$$

When the frequency $\omega$ is equal to $2\pi/T$, the phase of Equation (8) will be independent of time. The real and imaginary components of this result can be filtered without any corruption of the symbol phase information. The phase of the filtered values is then $$\arg\{c^2(t)e^{-i(\beta+\alpha x)}\} = \left(\frac{2\pi}{T} - \omega\right)t - \beta \qquad (9)$$

This is the output of the phase detector and is the error signal in the loop. The loop is stable at the point where $\omega=2\pi/T$. The closed loop tracker shown in FIG. 8 adjusts the frequency of the VCO to drive the loop to this stable point. Furthermore, if the loop filter F(s) includes an integrator, then the symbol phase error will be driven to zero and the symbol phase will be indicated by the phase of the VCO output.

FIG. 8 has many similarities to a BPSK carrier tracking loop. In which case, the problem is to recover the carrier from a signal $$d(t)\cos(\omega t) \qquad (10)$$

where $d(t)=\pm 1$. This can be accomplished by squaring the signal to obtain $$d^2(t)\cos^2(\omega t) = \frac{d^2(t)[1+\cos(2\omega t)]}{2} \qquad (11)$$

which is filtered with a phase locked loop to obtain a signal with twice the BPSK carrier frequency. For BFSK, the value of $d^2(t)$ is 1 so the time varying part of Equation (11) is sinusoidal. The same approach can be applied to other amplitude modulations of the form of Equation (10) so long as $d^2(t)$ is narrow band.

The purpose of the complex filter in FIG. 8 is to convert the CPM phase into one which is the product of a narrow band signal and a harmonic term. The squaring and phase locked loop that follow are the analogs of the BPSK carrier tracker.

Figure 9:
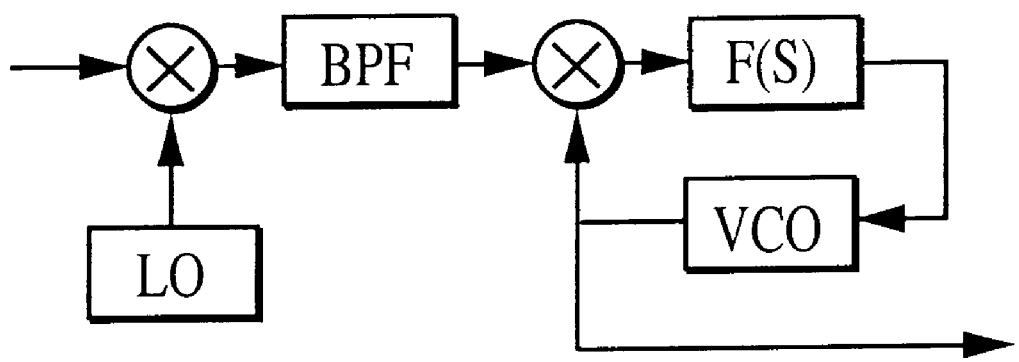
FIG. 9 is a simplified block diagram of the short loop and long loop receiver topologies.
Figure 9:
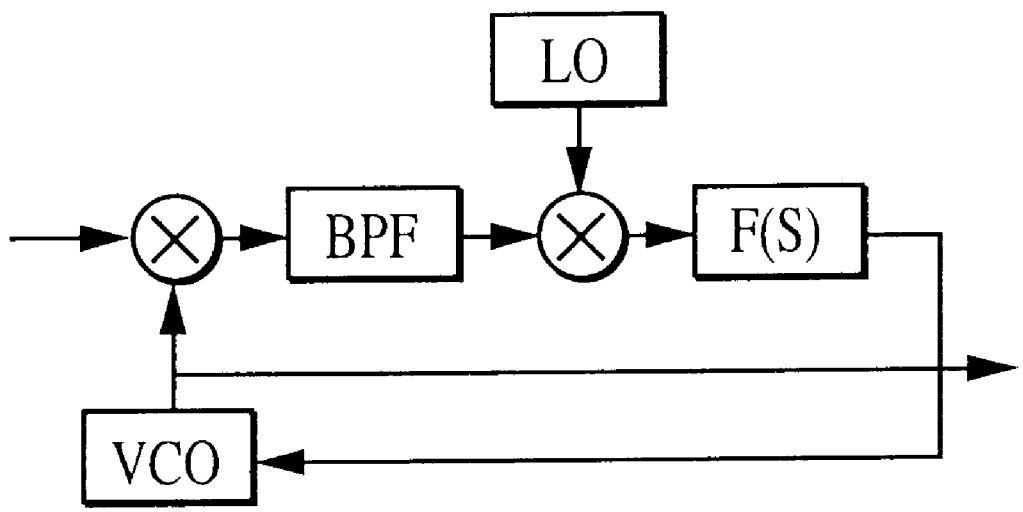

Before proceeding to the digital implementations of the CPM symbol tracker, the short loop and long loop receivers should be considered. Stylized receivers are shown in FIG. 9. The output of both the receivers is a filtered signal whose frequency is the difference of the input frequency and the LO frequency. The short loop receiver may be found wanting in cases where the input frequency is such that the output of the first mixer falls outside of the passband of the filter. In such a case, the long loop receiver is attractive. In that case the frequency of the output of the first mixer is constant at the frequency of the LO.

The receiver in FIG. 8 has only a single mixer, and so is neither a short nor a long loop receiver. The digital implementations will contain a digitizing clock which will serve the function of an additional mixing stage. A detailed description of both the short and long loop digital receivers follows.

Figure 10:
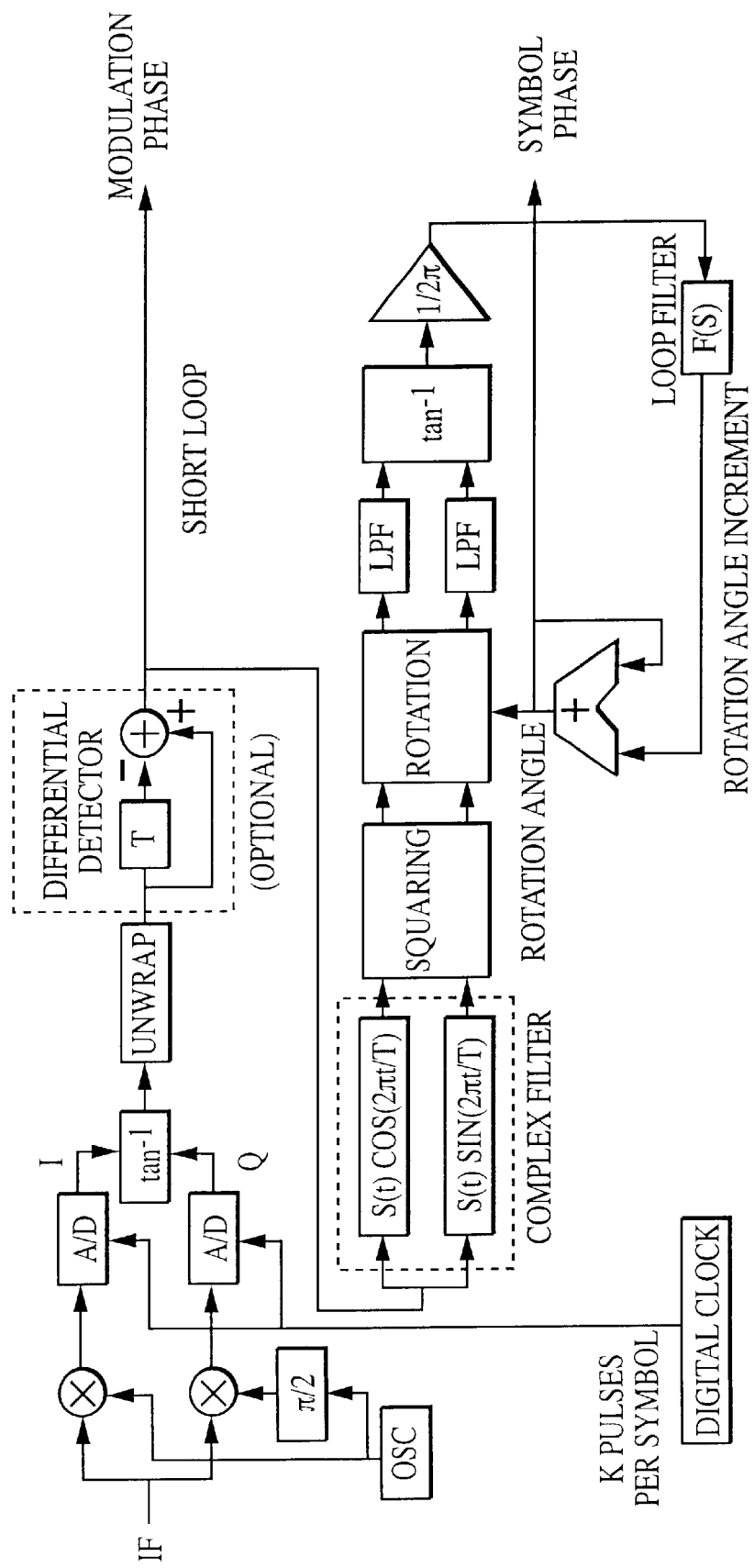
FIG. 10 is a block diagram of the short loop digital implementation of the symbol tracker.

The short loop digital implementation of the receiver in FIG. 8 is shown in FIG. 10. In that figure, the digital system is clocked K times during the nominal symbol interval T. The complex filter function is performed by a pair of filters that are implemented as a convolution of the input with sampled values of the real and imaginary parts of $f(t)$. The function of the VCO and the mixer in the loop are replaced by a phase adder and a digital phase rotation.

The steps of the method for symbol phase synchronization illustrated by FIG. 10 include the steps of: 1) generating a digital sample of the output of a quadrature demodulator as a function of a numerically controlled oscillator; 2) calculating an arctangent function of the digital sample; 3) for modulation systems which benefit by this step, eliminate carrier influences from the arctangent function with of a differential detector; 4) filtering said arctangent function to produce a pair of signals that represent a complex value whose phase changes at a rate which is half of the symbol rate with a filter such as defined by the impulse response $[q(t)-q(t-T)]\exp\{i\pi t/T\}$ where q(t) is the continuous phase modulation function and T is the interval between the start of successive symbols.; 5) squaring the complex value; 6) rotating the squared complex value a predetermined angle; 7) calculating a second arctangent function from the rotated complex value; 8) filtering the phase related signal with a loop filter of the type normally used in the industry, for example, a filter which exhibits the properties expressed by equation 16; 9) calculating the predetermined angle from the second arctangent function; and 10) summing the calculation of the predetermined angle with the second arctangent function.

Just as the output of the short loop receiver in FIG. 9 is relative to the LO frequency, the symbol phase output in FIG. 10 will be relative to the digitization rate. If the transmitter and receiver clocks are not synchronized, the symbol phase will drift with the frequency difference.

An unwrapping step is included in FIG. 10 between the phase extraction and the differencer for generality. The necessity of this step will depend on the maximum modulation phase that is expected in a given system.

If the transmitted symbol rate is significantly different from that assumed by the receiver clock, then the samples of s(t) upon which the pair of filters are based will not be well matched to the input data. This will result in an error in the determined symbol phase. This is similar to the situation in the short loop receiver where a large frequency shift of the input will cause the output of the first mixer to fall outside of the band pass filter. This problem is solved by the long loop receiver.

Figure 11:
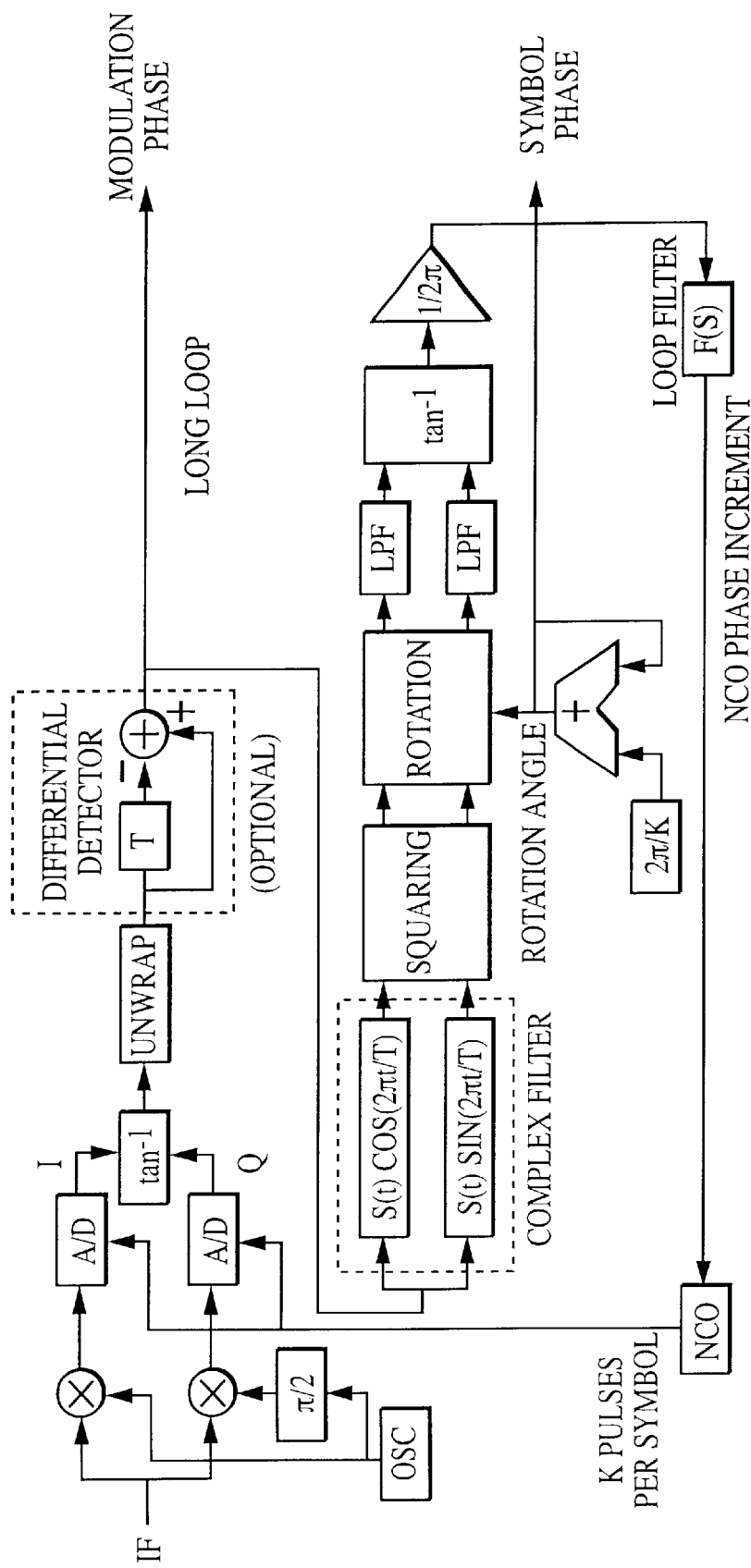
FIG. 11 is a block diagram of the long loop digital implementation of the symbol tracker.

The digital loop symbol tracker is shown in FIG. 11. In this case, the digital clock is replace by an NCO and the operation of the loop results in the NCO output being synchronous with the transmitted symbol rate. The rotation angle increment is now constant. Again, this is analogous to any long loop receiver in which the LO frequency is fixed and the output tracks the input frequency relative to the LO frequency.

The long loop receiver requires control over the digitization rate. In some cases this may be difficult or otherwise undesirable. In those cases, use of the short loop may be justified. The development above might appear to be equally applicable to all CPM modulation functions. This is not true. Applicability will depend on the nature of the function A(t). This function can be written as $$A(t) = \frac{1}{2\pi}e^{\frac{-i\pi t}{T}}\int d\omega S(\omega)S\left(\omega + \frac{2\pi}{T}\right)e^{-i\omega x} \qquad (12)$$

where $$S(\omega) = \int dt s(t)e^{i\omega x} \qquad (13)$$

We can see from Equation (12) that A(t) depends on an overlap of the functions $S(\omega)$ and $S(\omega+2\pi/T)$. Because $S(\omega)$ is Hermitian as a result of s(t) being a real function, such an overlap will not exist unless $S(\omega)$ has at least some of its energy at frequencies beyond $\pi/T$, which is half of the symbol rate. Therefore, if all of the energy in the function s(t) lies within a frequency band $\pm\pi/T$, then the symbol synchronization approach described here is not applicable. If, on the other hand, the modulation includes some energy at frequencies in excess of half the symbol rate, then this approach may be considered.

While Equation (10) presents a restriction on the use of this approach, restrictions that are often present in other synchronization techniques are not present here. For example, there are no restrictions on the modulation index. Provided that phase ambiguities, if any are present, can be resolved, then this method may be used with any value of the modulation index including irrational values. There are no restrictions on the size or composition of the symbol values. The approach works equally well with binary and M-ary systems. The symbol values themselves may take on any set of values. This approach therefore provides a great deal of flexibility in the construction of a communications system.

The method is not decision aided, i.e. it does not make use of the recovered symbol values. A maximum likelihood symbol tracker requires such symbol recovery. Not using the symbol values simplifies the hardware and avoids the problems of false lock that can occur in decision aided trackers, but some performance penalty must be paid for the use of other than a maximum likelihood approach.

The two low pass filters (LFP) in FIGS. 10 and 11 need not have equal bandwidths. It is only necessary that they have the same zero frequency gain.

The symbol tracking loops shown in FIGS. 10 and 113 are applicable for a variety of CPM modulation functions and tolerate a range of signal-to-noise ratios as expressed by the following simulation functions which reflect the operation of the loops. Timing jitter may be computed by collecting the statistics of the difference of the symbol phase indicated by the rotation angle and the true symbol phase that is known within the simulation. Initial symbol phase and frequency offsets are applied to demonstrate the acquisition performance of the tracking loops.

Computer simulations of the symbol tracking have been performed. Noise is added to the I & Q channels prior to the inverse tangent function. The noise is independent in each channel and in each sample. The standard deviation of the Gaussian random noise is $$std\{noise\} = \sqrt{\frac{K}{2\left(\frac{E_b}{N_0}\right)\log_2 M}} \quad (14)$$

where K is the number of samples per symbol and M is the number of possible symbols. The detected phase is adjusted so that the magnitude of the difference between successive phase samples is less than $\pi$.

The low pass filters in FIGS. 10 and 11 may be simple single-pole filters providing an output $y_n$ which is defined by $$y_n = \gamma y_{n-1} + x_n \quad (15)$$

where $x_n$ is the nth filter input and $\gamma$ is a damping coefficient. The loop filter is of the form $$F(s) = \frac{s\tau_2 + 1}{s\tau_1} \quad (16)$$

and is digitally implemented as $$y_n = d_1 x_n + w_n$$
$$w_n = d_2 x_n + w_{n-1} \quad (17)$$

where $x_n$ is the filter input, $y_n$ is the filter output, and $d_1$ and $d_2$ are constants. The quantity $w_n$ is internal to the filter and represents the integrator portion of the filter.

The nominal symbol rate is 1 Hz. The NCO contains an accumulator that is 26 bits wide and is clocked at a rate of 40% Hz. The nominal increment is 65536, providing an output pulse at a rate of 4 Hz. The actual increment in the long loop is equal to 65536+$y_n$. There are nominally 4 samples per symbol start interval.

In the short loop, the digital clock rate is fixed at 4 Hz. The angle increment is computed from the loop filter output as $$\frac{2\pi}{K}[1 - \frac{z_n}{65536}] \quad (18)$$

The steps involve in symbol tracking with a long loop are illustrated in FIG. 11. The more significant steps are: 1) generating a digital sample of the output of a quadrature demodulator as a function of a numerically controlled oscillator; 2) calculating an arctangent function of the digital sample; 3) for modulation systems which benefit by this step, eliminate carrier influences from the arctangent function with of a differential detector; 4) filtering said arctangent function to produce a pair of signals that represent a complex value whose phase changes at a rate which is half of the symbol rate with a filter such as defined by the impulse response $[q(t)-q(t-T)]\exp\{i\pi t/T\}$ where q(t) is the continuous phase modulation function and T is the interval between the start of successive symbols.; 5) squaring the complex value; 6) rotating the squared complex value a predetermined angle; 7) calculating a second arctangent function from the rotated complex value; 8) producing a phase related signal from the second arctangent function; 9) filtering the phase related signal with a loop filter of the type normally used in the industry, for example, a filter which exhibits the properties expressed by equation 16; and 10) regulating the numerically controlled oscillator with said phase related signal.

As an example of symbol tracking with the long loop system shown in FIG. 11, consider the case of minimum shift keying (MSK). In this case, we have the following characterization:

$h=\frac{1}{2}$, $a_n=\pm 1$ $q(t)=0$ if $t<0$ $q(t)=\frac{1}{2}T$ if $0<t<T$ $q(t)=\frac{1}{2}$ if $T<t$ $\gamma=0.9$ $d_1=500$, $d_2=0.5$ (19)

Figure 12:
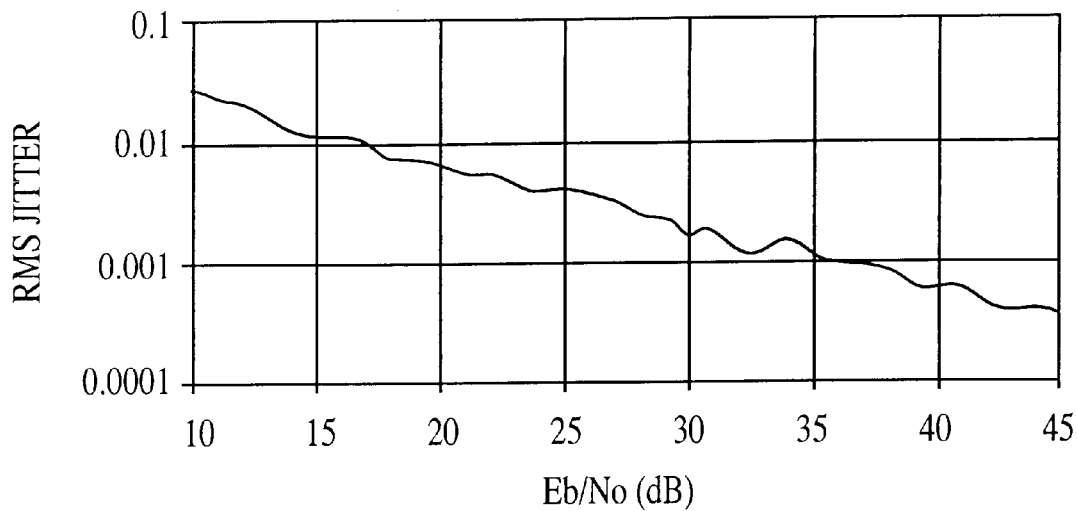
FIG. 12 is a timing jitter vs. db curve for MSK modulation.

The results of symbol synchronization for the long loop tracker are shown in FIG. 12. The figure shows the rms symbol timing error as a function of $E_b/N_0$. The rms error falls as $\sqrt{E_b/N_0}$.

The short loop performance without a frequency offset is roughly equivalent to that of the long loop synchronizer. As the transmitter symbol frequency changes, a symbol phase error is observed as $$\delta t = \delta f \times 0.80 s^2 \quad (20)$$

so that an offset of 0.001 Hz in the symbol rate will introduce a timing error of 0.0008 sec. This error can be removed by using the rotation angle increment as an indicator of the frequency offset and computing a timing correction based on Equation (20). The necessity for such a correction in the closed loop system will depend on the system requirements and upon the expected differences between the transmitter and receiver clocks due to Doppler shifts or oscillator drifts.

For the MSK case above, there are discontinuities in the modulation frequency at the symbol rate. In the raised cosine case, the frequency is continuous. The modulation phase is of the form $$q(t)=0 \text{ if } t<0$$

$$q(t) = \frac{t}{2LT} - \frac{\sin\left(\frac{2\pi t}{LT}\right)}{4\pi} \text{ if } 0 < t < LT \quad (21)$$

$$q(t)=\tfrac{1}{2} \text{ if } LT<t$$

where L is a parameter that is equal to the number of symbol intervals over which the modulation phase changes. In the case of 1, 3, and 5 bit symbols (M=2, 8, and 32). The symbols will take on the values expressed by $$a = \frac{k}{2M-1}, \quad k \in \{-M+1, -M+3, \ldots, M-1\} \quad (22)$$

where M is the number of possible symbols.

Figure 13:
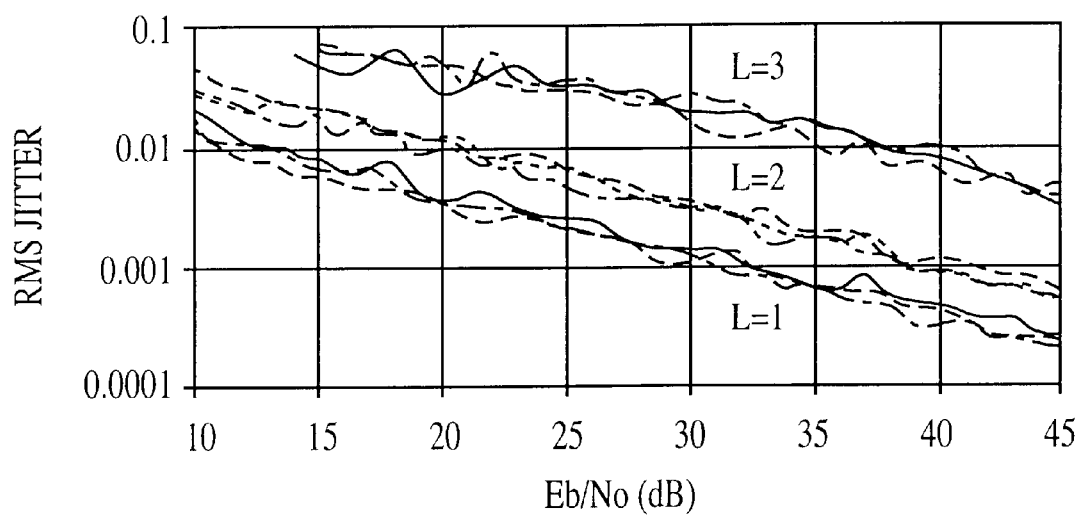
FIG. 13 presents three raised cosine tracking jitter curves, one each corresponding to M=2, 8, and 32.

The tracking results for L=1, 2, and 3 are shown in FIG. 13. The performance is seentobe independent of M, and strongly dependent on L. This latter dependence is consistent with the decreasing bandwidth of the modulation with increasing L. The power in the A(t) function decreases by 13 db in going from L=1 to L=2 and by 32.5 db in going from L=1 to L=3. Nonetheless, synchronization is accomplished with these smooth modulation functions.

The embodiment demonstrates an independence of rms jitter and improves as M increases because the phase noise is reduced for a constant value of $E_b/N_0$. This is some what mitigated by a reduction in the rms symbol values but the improvement is about 1 db for M=8 and about 2.5 db for M=32. The general improvement is defined by $$\frac{M+1}{3(M-1)}\log_2(M) \quad (23)$$

The symbol synchronization method described here has been tested on a wide variety of CPM modulation functions, some of which have been designed to minimize the signal bandwidth. These possess only a small amount of energy at frequencies that are greater than half of the symbol rate. Nonetheless, the method has performed well in all applications.

Figure 14:
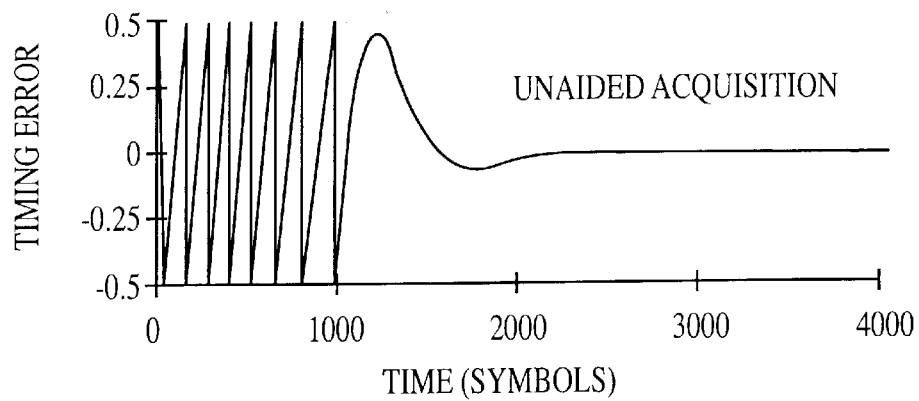
FIG. 14 is a graph of symbol acquisition for the raised cosine with an initial frequency offset of 1% and $E_b/N_0$=20 db.

In the simulations described above, the frequency of the NCO in FIG. 11 is initialized with the correct value and only phase acquisition is required. With the loop parameters employed here, a 1% frequency offset between the transmitter and the receiver can be acquired in about 2000 symbols for the raised cosine modulation with L=1, M=32, and $E_b/N_0$=20 db. Acquisition for this case is shown in FIG. 14.

Figure 15:
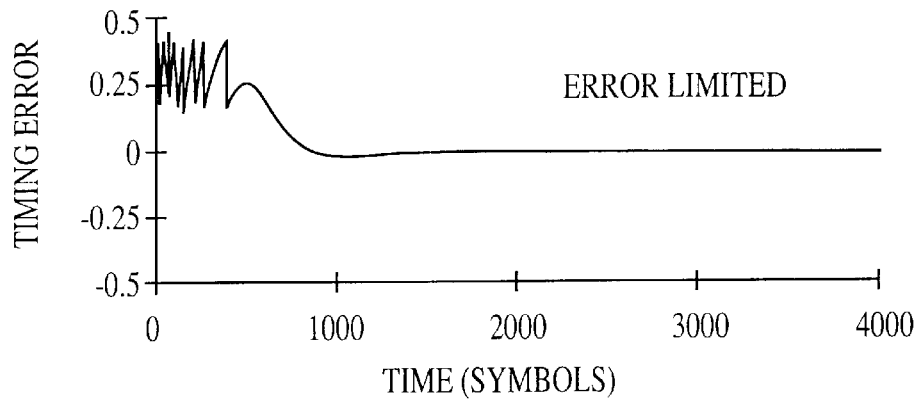
FIG. 15 is a graph of symbol acquisition for the raised cosine with an initial frequency offset of 1% and $E_b/N_0$=20 db when the error signal is limited to be within the range ±40% of the symbol interval.

Frequency acquisition for both the short and long loops can be improved by limiting the error signal to be within the range ±40% of the symbol interval. This can be done with the following logic:

if the absolute value of error>40% then
set x to ±2π/k depending on the sign of the error
add x to the rotation angle
rotate the low pass filter accumulators by angle x FIG. 15 shows the resulting performance. The acquisition time is reduced to about half of the original value.

Figure 16:
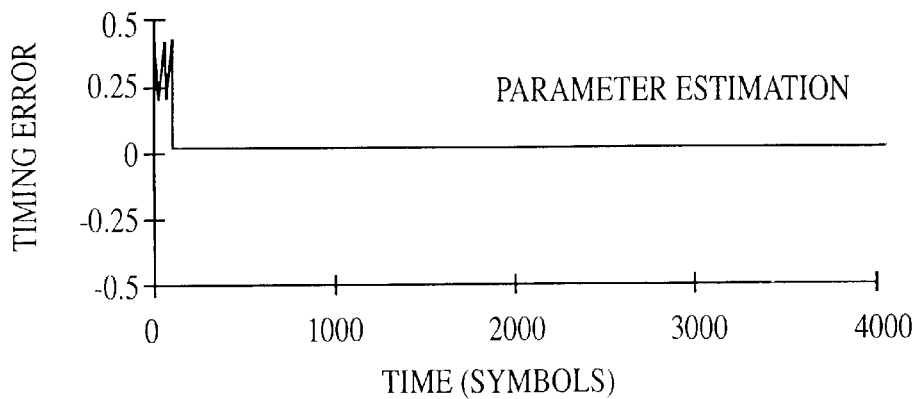
FIG. 16 is a graph of symbol acquisition for the raised cosine using a parameter estimation with an initial frequency offset of 1% and $E_b/N_0$=20 db.

Further improvement is possible for the short loop synchronizer by estimating the symbol frequency from the rotation angle and the error signal. Once an estimate of the symbol frequency has been made, the loop filter can be adjusted and the error can be removed by changing the rotation angle. The resulting performance is shown in FIG. 16. Parameter estimation is delayed until after 100 symbols have been received. The timing errors are small after that point. By comparison, the unaided acquisition requires about 2000 symbols to settle down.

The symbol phase synchronization procedure described herein is tolerant to the presence of unremoved carrier phase. Such a phase will be present if the LO signal in FIGS. 10 and 11 does not exactly match the carrier frequency in the I.F. channel input. This insensitivity is largely due to the presence of the differential detector which converts a frequency offset into a constant phase offset. This constant offset is averaged out in the filtering that follows the phase rotation. Simulations have shown that jitter statistics are not affected by a residual carrier frequency that is 10% of the symbol rate.

If a carrier tracking loop is employed, then it should be given a very small bandwidth. Noise in the carrier tracking loop output will affect symbol synchronization more than a constant offset.

The forgoing presents a general symbol synchronization procedure including simulations of symbol phase and frequency tracking. The method successfully acquires and tracks the transmitted symbols under a wide variety of initial conditions. The only constraint on the use of the method is that the modulation function must include some energy at frequencies that exceed half of the symbol rate. Within this constraint the method may be applied to the entire class of CPM modulations.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

What is claimed is:

1. A method for symbol phase synchronization, including the steps of:
    digitizing an output of a quadrature demodulator as a function of a numerically controlled oscillator;
    calculating an arctangent function from said digitized data;
    sampling said arctangent function to create a phase related signal for updating a loop filter once per symbol said step of sampling including the steps of:
        producing a pair of signals by filtering said arctangent function with a complex error filter;
        calculating a secondary arctangent function from said pair of signals; and
        dumping said secondary arctangent function to produce said phase related signal; and
    regulating said numerically controlled oscillator with a function of said phase related signal processed by said loop filter.

2. A method for symbol phase synchronization as defined by claim 1, wherein said complex error filter is defined by the impulse response $[q(t)-q(t-T)]\exp\{i\pi t/T\}$ where q(t) is the continuous phase modulation function and T is the interval between the start of successive symbols.

3. A method for symbol phase synchronization as defined by claim 2, including the step of eliminating carrier influences from said arctangent function prior to said step of sampling.

4. A method for symbol phase synchronization, including the steps of:
   digitizing an output of a quadrature demodulator as a function of a numerically controlled oscillator;
   calculating an arctangent function from said digitized data;
   sampling said arctangent function to create a phase related signal for updating a loop filter once per symbol said step of sampling including the steps of:
      filtering said arctangent function to produce a pair of signals that represent a complex value whose phase changes at a rate which is half of the symbol rate;
      squaring said complex value;
      rotating said squared complex value a predetermined angle;
      calculating a second arctangent function from said rotated complex value; and
      calculating said predetermined angle from said second arctangent function; and
   regulating said numerically controlled oscillator with a function of said phase related signal processed by said loop filter.

5. A method for symbol phase synchronization as defined by claim 4, wherein said step of filtering said arctangent function is defined by the impulse response $[q(t)-q(t-T)]\exp\{i\pi t/T\}$ where $q(t)$ is the continuous phase modulation function and T is the interval between the start of successive symbols.

6. A method for symbol phase synchronization as defined by claim 5, wherein said step of calculating said predetermined angle includes the further step of summing a previous value of said predetermined angle and an increment computed by scaling and filtering said second arctangent function.

7. A method for symbol phase synchronization as defined by claim 6, including the step of eliminating carrier influences from said arctangent function prior to said step of sampling.

8. A method for symbol phase synchronization, including the steps of:
   digitizing an output of a quadrature demodulator as a function of a numerically controlled oscillator;
   calculating an arctangent function from said digitized data;
   sampling said arctangent function to create a phase related signal for updating a loop filter once per symbol said step of sampling including the steps of:
      filtering said arctangent function to produce a pair of signals that represent a complex value whose phase changes at a rate which is half of the symbol rate;
      squaring said complex value;
      rotating said squared complex value a predetermined angle;
      calculating a second arctangent function from said rotated complex value; and
      producing said phase related signal from said second arctangent function; and
   regulating said numerically controlled oscillator with a function of said phase related signal processed by said loop filter.

9. A method for symbol phase synchronization as defined by claim 8, wherein said step of filtering said arctangent function is defined by the impulse response $[q(t)-q(t-T)]\exp\{i\pi t/T\}$ where $q(t)$ is the continuous phase modulation function and T is the interval between the start of successive symbols.

10. A method for symbol phase synchronization as defined by claim 9, including the step of eliminating carrier influences from said arctangent function prior to said step of sampling.

11. An apparatus for symbol phase synchronization in a receiver utilizing continuous phase modulation and a quadrature demodulator, comprising:
   first and second analog-to-digital converters driven by outputs of said quadrature demodulator;
   means for calculating an arctangent function from the digital outputs of said first and second analog-to-digital converters;
   means for sampling said arctangent function said sampling means comprising:
      an integrating means for said arctangent function;
      means for periodically dumping data accumulated by said integrating means for said arctangent function;
      a complex error filter for reducing said arctangent function to a dual output signal; and
      means for generating a secondary arctangent function from said dual output signal;
   means for generating a phase related output function from said sampled arctangent function; and
   a number controlled oscillator for regulating said first and second analog-to-digital converters in response to said output function.

12. An apparatus for symbol phase synchronization as defined by claim 11, wherein said complex error filter is defined by the impulse response $[q(t)-q(t-T)]\exp\{i\pi t/T\}$ where $q(t)$ is the continuous phase modulation function and T is the interval between the start of successive symbol.

13. An apparatus for symbol phase synchronization in a receiver incorporating continuous phase modulation and a quadrature demodulator, comprising:
   first and second analog-to-digital converters driven by outputs of said quadrature demodulator and regulated by a digital clock;
   means for producing an arctangent function from outputs of said first and second analog-to-digital converters;
   filter means for producing a complex value by producing a pair of signals whose phase changes at a rate which is half of the symbol rate;
   means for squaring said complex value;
   means for rotating said squared complex value;
   means for calculating a second arctangent function from said rotated squared complex value; and
   means for controlling said means for rotating said squared complex value in response to said second arctangent function.

14. An apparatus for symbol phase synchronization as defined by claim 13, wherein said filter means is defined by the impulse response $[q(t)-q(t-T)]\exp\{i\pi t/T\}$ where $q(t)$ is the continuous phase modulation function and T is the interval between the start of successive symbols.

15. Apparatus as defined by claim 14, wherein said digital clock is incremented by a function of the number of pulses per symbol.

16. An apparatus for symbol phase synchronization in a receiver incorporating continuous phase modulation and a quadrature demodulator, comprising:

first and second analog-to-digital converters driven by outputs of said quadrature demodulator and regulated by a numerically controlled oscillator;

means for producing an arctangent function from outputs of said first and second analog-to-digital converters;

filter means for producing a complex value from said arctangent function by producing a pair of signals whose phase changes at a rate which is half of the symbol rate;

means for squaring said complex value;

means for rotating said squared complex value;

means for calculating a second arctangent function from said rotated squared complex value; and means for controlling the frequency of said numerically controlled oscillator in response to said second arctangent function.

17. An apparatus as defined by claim 16, comprising means for controlling said means for rotating said squared complex value in response to the number of samples per symbol.

18. Apparatus as defined by claim 17, comprising a differential detector for producing an output signal clear of carrier influence from said arctangent function and applying it to the input of said filter means.

19. An apparatus for symbol phase synchronization as defined by claim 18, wherein said filter means is defined by the impulse response $[q(t)-q(t-T)]\exp\{i\pi t/T\}$ where $q(t)$ is the continuous phase modulation function and T is the interval between the start of successive symbols.

* * * * *